United States Patent [19]

Cok et al.

[11] Patent Number: 4,573,023
[45] Date of Patent: Feb. 25, 1986

[54] MULTIPLE-MULTIPLE MODULUS PRESCALER FOR A PHASE-LOCKED LOOP

[75] Inventors: Steven P. Cok; Eric R. Drucker, both of Seattle, Wash.

[73] Assignee: John Fluke Mfg. Co., Inc., Everett, Wash.

[21] Appl. No.: 638,631

[22] Filed: Aug. 7, 1984

[51] Int. Cl.$^4$ .................. H03L 7/18; H03K 21/00
[52] U.S. Cl. .................... 331/1 A; 331/16; 331/25; 377/48
[58] Field of Search ............ 331/1 A, 16, 25; 455/260, 183; 328/14; 377/48

[56] References Cited

U.S. PATENT DOCUMENTS

| | | | |
|---|---|---|---|
| 3,959,737 | 5/1976 | Tanis | 331/1 A |
| 4,123,724 | 10/1978 | Das et al. | 331/1 A |
| 4,344,045 | 8/1982 | Das et al. | 331/1 A |
| 4,360,788 | 11/1982 | Erps et al. | 331/1 A |

OTHER PUBLICATIONS

Motorola Application Note AN-827, "The Technique of Direct Programming by using a Two-Modulus Prescaler", Motorola Inc., 1981.

*Primary Examiner*—Siegfried H. Grimm
*Attorney, Agent, or Firm*—Mikio Ishimaru; Stephen A. Becker

[57] ABSTRACT

A three modulus prescaler for a phase-locked loop frequency synthesizer includes a $N_0$ modulus prescaler inputting into a divide-by-two circuit. A microprocessor and internal logic control a three modulus prescaler synchronizer to receive signals from the divide-by-two circuit and output control commands to the $N_0$ modulus prescaler so as to cause the $N_0$ modulus prescaler to divide solely by a first or second modulus, or alternately between said first and second modulus, between output pulses of the divide-by-two circuit to extend the synthesizer's bandwidth.

8 Claims, 3 Drawing Figures

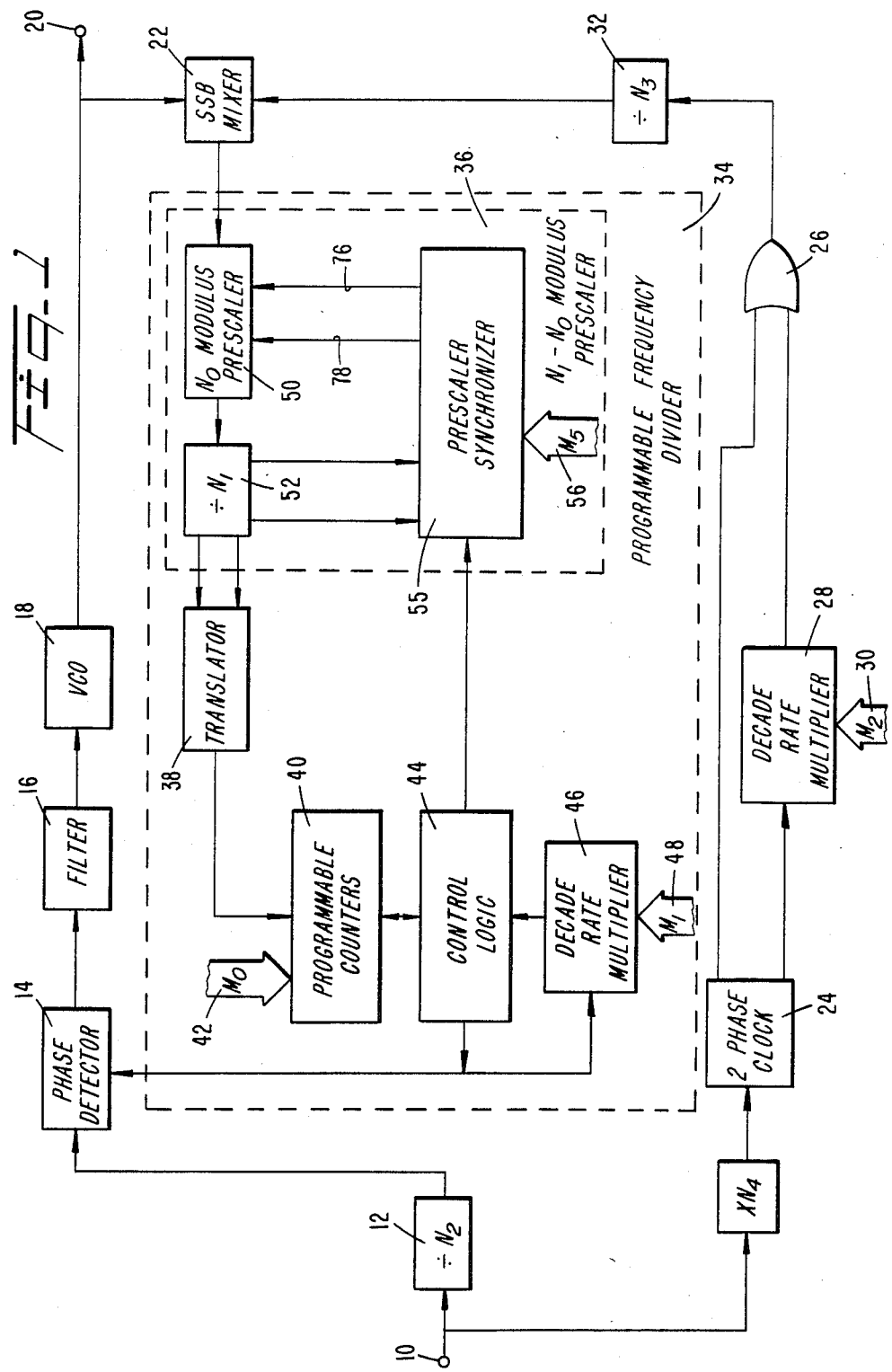

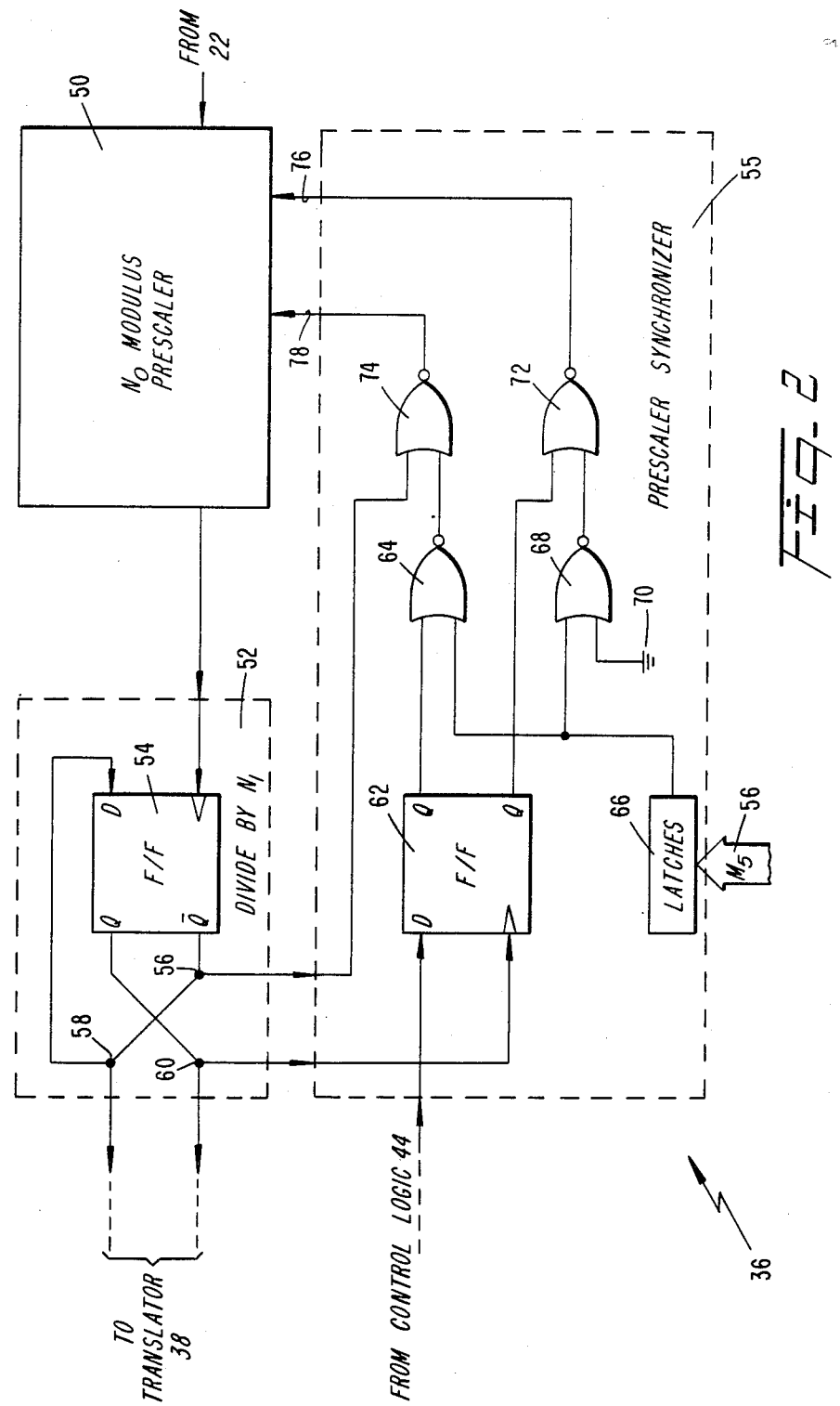

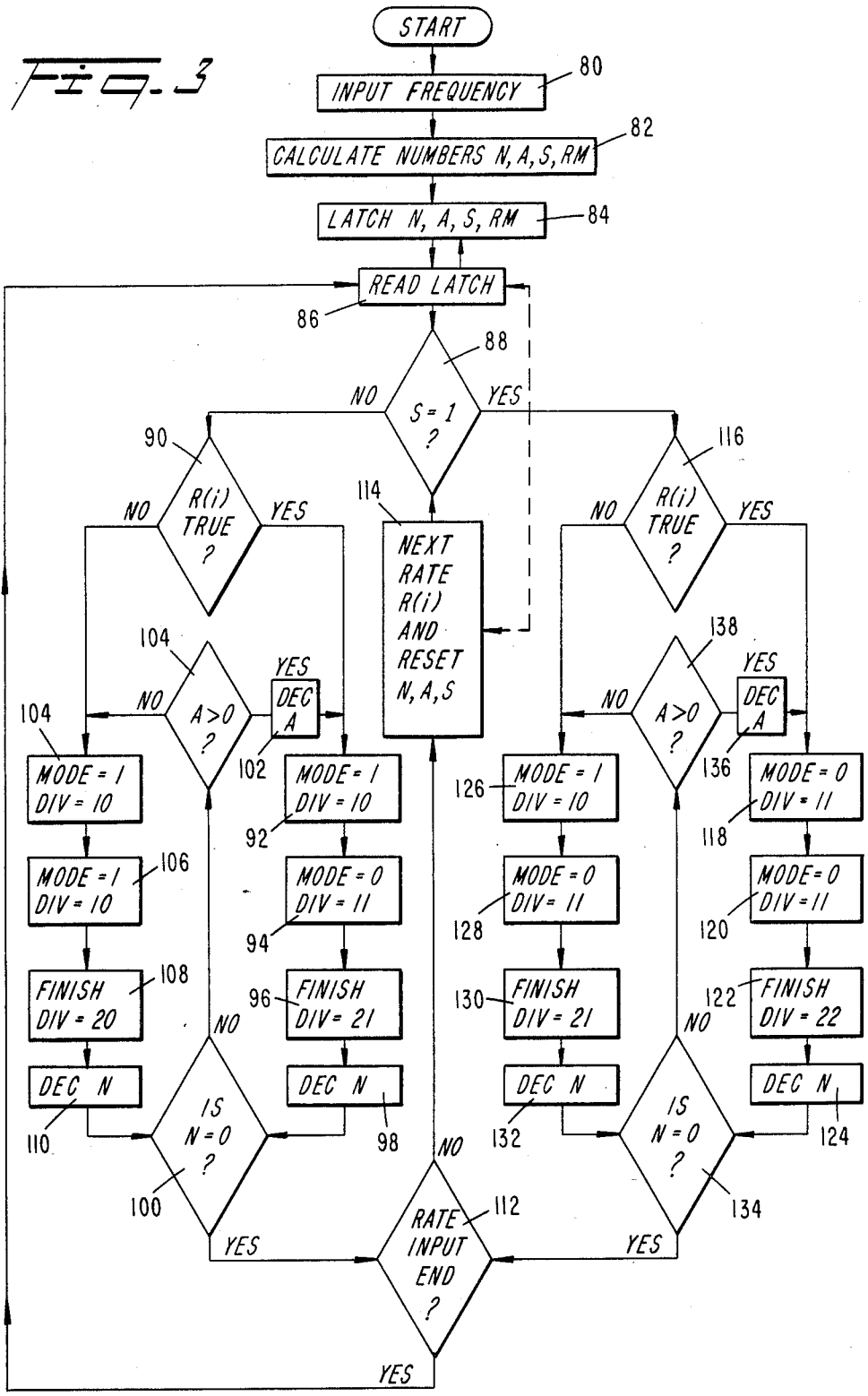

MULTIPLE-MULTIPLE MODULUS PRESCALER FOR A PHASE-LOCKED LOOP

FIELD OF THE INVENTION

The invention relates generally to the field of frequency synthesis and more particularly to phase-locked loop frequency synthesis in which the prescaler is operable to provide multiple-multiple combinations of moduli.

BACKGROUND OF THE INVENTION

Generally, the background of the present invention is described in the "Phase-locked Loop Frequency Synthesizer" U.S. Pat. No. 4,360,788 granted to Floyd D. Erps and Raymond L. Fried on Nov. 23, 1982 and is incorporated herein by reference thereto.

Briefly, frequency synthesis encompasses various methods and apparatus wherein a frequency conversion process is utilized to translate the signal frequency of one or more reference signals to a large number of output signal frequencies that are relatively stable in frequency and relatively pure in spectral content, each of which output frequencies can be individually selected as the frequency of the synthesizer output signal.

One of the methods and apparatus for frequency synthesis utilizes an "indirect" technique in which a programmable divide-by-N phase-locked loop is used to achieve a desired output bandwidth and frequency resolution along with rapid switching speed and reduced level of noise suppression.

The programmable divide-by-N phase-locked loop is essentially a feedback system in which an error signal that is proportional to the phase difference between a feedback signal and a fixed reference signal is generated within a phase detector circuit. This error signal is low-pass filtered and utilized to control the frequency of a voltage controlled oscillator (VCO) circuit which supplies the synthesizer output signal. The synthesizer output signal is modified by a single sideband mixer and then divided in a programmable frequency divider circuit by a selectable factor, N, and then is fed to the phase detector. Since the phase-locked loop will synchronize when the error signal is zeroed by the phase of the feedback signal being substantially identical to the phase of the fixed reference signal, the VCO will supply the synthesizer output signal at a frequency N times the frequency of the fixed reference signal plus a minor offset frequency.

As part of the programmable frequency divider circuit, it has been common to use a two modulus prescaler which allows the programmable divide-by-N phase-locked loop to have a relatively high frequency resolution and relatively wide output bandwidth, e.g., one or more octaves. However, as time passes, it becomes more and more desirable to have very wide output bandwidth at a minimum expense and without affecting the switching speed or frequency resolution. Further, as the frequency range of desired signals increases, certain frequencies cannot be produced in a phase-locked loop system using only a two modulus prescaler.

SUMMARY OF THE INVENTION

The present invention provides a multiple-multiple modulus prescaler to be introduced into the programmable frequency divider circuitry of the phase-locked loop circuit of an indirect frequency synthesizer. This prescaler effectively provides multiple moduli, as required, to allow the frequency synthesizer to produce heretofore unobtainable low frequencies.

The present invention provides a programmable divide-by-N phase-locked loop having an increased output bandwidth, which was not heretofore possible, while maintaining good frequency resolution.

The present invention can further use low-cost transistor-transistor logic (TTL) for the majority of the prescaler where the operating speeds are under 30 MHZ and the more expensive high-speed (above 500 MHZ) emitter-coupled logic (ECL) only where required.

Another advantage of the present invention is the ability to have a phase-locked loop synthesizer circuit having a low parts count while being capable of synthesizing an output signal over at least an octave-wide frequency range with very good frequency resolution.

An additional advantage of the present invention is the ability to obtain a phase-locked loop frequency synthesizer having a wide output frequency range and a very good frequency resolution in which the desired output frequency can be initiated by simple programming signals.

The above and additional advantages of the present invention will become apparent to those skilled in the art from a reading of the following detailed description when taken in conjunction with the accompanying drawings.

BRIEF DESCRIPTION OF THE DRAWINGS

FIG. 1 is a block diagram of the frequency synthesizer incorporating the present invention;

FIG. 2 is a schematic illustration partially in block form of the programmable frequency divider of the present invention;

FIG. 3 is part of a flow chart of the program used in the controller of the present invention.

DESCRIPTION OF THE PREFERRED EMBODIMENT

The present invention is an improvement on the phase-locked loop frequency synthesizer disclosed in the Erps et al patent, supra; and the disclosure therein is incorporated herein by reference thereto.

Referring now to FIG. 1, therein is shown the indirect frequency synthesizer which incorporates the present invention. A relatively stable signal having substantial spectral purity at a high frequency of $N_2$ times a fixed reference frequency of $F_r$ is supplied to an input terminal 10. The signal is then divided in a conventional divide-by-$N_2$ circuit 12 and supplied to a phase detector 14 as the phase-locked loop reference frequency $F_r$. The output of the phase detector 14 is an error signal which is low-pass filtered in a filter circuit 16 to attenuate high frequency components. The filtered error signal then controls a conventional voltage controlled oscillator (VCO) 18 which outputs a synthesizer output frequency signal $F_v$ at an output terminal 20.

The production device incorporating the present invention has an optional single sideband (SSB) mixer 22 and related circuitry to be hereinafter described. As would be evident to those skilled in the art, the present invention would be operable even in an older type phase-locked loop frequency synthesizer without the SSB mixer 22 and related circuitry.

The SSB mixer 22 is controlled by a mixer control frequency $F_s$ which is obtained from the original $N_2F_r$ signal. The $N_2F_r$ signal, obtained from the input 10, is provided to a conventional multiply by $N_4$ multiplier circuit 23 and the multiplied output is provided to a two-phase clock 24 which is coupled directly to one input terminal of an OR gate 26 and through a conventional decade rate multiplier 28 (it should be noted that the multipliers herein could just as easily be decade, binary, quinary, or biquinary rate multipliers) to the other input terminal. The decade rate multiplier 28 is controlled by signals transmitted over a microprocessor bus from a conventional control microprocessor (not shown) which provides multiplier commands $M_2$ as designated by the arrow 30. As evident, the OR gate 26 will output a signal having a frequency of $N_4N_2F_r$ $(1+M_2/10^p)$, where p is the number of stages included in the decade rate multiplier 28. The output of the OR gate 26 is connected to a conventional divide-by-$N_3$ circuit 32 before being provided to the SSB mixer 22.

As explained in Erps et al, the signal from the SSB mixer 22 is provided to a programmable frequency divider 34 which is programmable to divide the SSB mixer signal and provide it to the phase detector 14.

The programmable frequency divider 34 consists of a $N_0$ modulus prescaler 36, which will be described in greater detail later, which provides two outputs to an emitter coupled logic (ECL) to transistor-transistor logic (TTL) translator 38. The translator 38 provides signals to a programmable counter 40 which is coupled to the microprocessor bus which inputs counter command signals $M_c$ as shown by arrow 42. The programmable counters 40 are connected to provide signals to and respond to signals from a control logic 44.

The control logic 44 outputs signals to the phase detector 14 as the output of the programmable frequency divider 34 and those output signals are used by a decade rate multiplier 46 which is connected to the microprocessor bus to receive rate command signals $M_1$ as designated by the arrow 48. The decade rate multiplier 46 provides its output signals to the control logic 44.

In the preferred embodiment, to reduce the number of parts, the decade rate multiplier 28, the OR gate 26 and the divide-by-$N_3$ circuit 32 are made part of a single gate array integrated circuit which is designed as would be evident to those skilled in the art. Similarly, the programmable counters 40, the control logic 44, and the decade rate multiplier 46 are incorporated into another single gate array integrated circuit. Both gate arrays are provided with the necessary latches to respond to the microprocessor bus commands 30, 42, and 48 as would be evident to those skilled in the art as being necessary for proper operation.

Referring now to FIG. 2, therein is shown the multiple-multiple $N_1$-$N_0$ modulus prescaler 36 of the present invention. The output of the SSB mixer 22 is provided to a $N_0$ modulus prescaler 50, which in the preferred embodiment is a conventional two modulus prescaler of the type described in Erps et al and commercially available from Motorola Corporation of Schaumburg, Ill. In the preferred embodiment, the two moduli are 10 and 11.

The $N_0$ modulus prescaler 50 provides its output to a divide-by-$N_1$ circuit 52. The $N_1$ circuit provides the capability of having multiple moduli with a single $N_0$ modulus prescaler. In the preferred embodiment $N_1$ is equal to 2 and with $N_0$ equal to 2, a two-two modulus prescaler is presented.

The divide-by-$N_1$ circuit 52, where $N_1$ equals 2, consists of a conventional flip-flop 54 and circuit nodes 56, 58, and 60. The clock input of the flip-flop 54 is connected to the $N_0$ modulus prescaler 50 and its D input is connected to its Q-bar output via nodes 56 and 58. The node 58 in turn provides the Q-bar output to the translator 38. The Q output of the flip-flop 54 is connected to the translator 38 via node 60. Nodes 56 and 60 provide outputs from the divide-by-$N_1$ circuit 52 to a prescaler synchronizer 55.

The prescaler synchronizer 55 includes a conventional flip-flop 62 having its clock input connected to the node 60 and its D input connected to the control logic 44. The Q output of the flip-flop 62 is connected to the first input of a NOR gate 64. The second input of the NOR gate 64 is connected to the ouput of latches 66.

The latches 66 are coupled to the microprocessor bus which inputs synchronizer control signals $M_5$ as shown by arrow 56. The synchronizer control signals $M_5$ are provided in accordance with the flow chart in FIG. 3 which will be explained in greater detail later. The latches 66 are further connected to the first input of a NOR gate 68. The second input of the NOR gate 68 is connected to a ground 70. The Q-bar output of the flip-flop 62 is connected to the first input of a NOR gate 72 which has its second input connected to the output of the NOR gate 68. The output of the NOR gate 72 is provided as one control signal over a first control input 76 to the two modulus prescaler 50.

The NOR gate 64 provides its output to the first input of a NOR gate 74 which has its second input connected to the node 56 in the divide-by-$N_1$ circuit 52. The output of the NOR gate 74 provides a second control signal over a second control input 78 to the $N_0$ modulus prescaler 50.

While operation of the overall frequency synthesizer is discussed in Erps et al, essentially, a high frequency stable reference is supplied to the input 10 and thence to the divide-by-$N_2$ circuit 12 where it is reduced to provide the reference frequency $F_r$ to the phase detector 14. The phase detector 14 provides an error output which is proportional to the difference between the phases of $F_r$ and the output of the programmable frequency divider 34. This error output is filtered by the filter 16 to control the VCO 18 to provide the desired synthesized frequency output at output terminal 20. Changes in the synthesized frequency are achieved by changing signals $M_1$, $M_2$, $M_c$, and $M_5$.

In the programmable frequency divider 34, as shown in FIG. 2, the signal from the SSB mixer 22 is provided to the $N_0$ modulus prescaler 50 which is selected to be controlled by the signals on the control inputs 76 and 78. With the two modulus prescaler of the preferred embodiment, the moduli are 10 and 11 (represented as 10/11).

If the control inputs 76 and 78 are both low, the $N_0$ modulus prescaler 50 divides by 11, i.e., outputs one pulse out for each eleven pulses in. Thus, the $N_0$ modulus prescaler 50 will normally divide by 11 but will switch to dividing by 10 whenever either or both of the control input leads 76 and/or 78 are high.

The output of the $N_0$ modulus prescaler 50 is provided to the divide-by-$N_1$ circuit 52. In the preferred embodiment, where $N_1=2$, the circuit will exhibit a first positive going edge of a pulse and then allow two divisions by the two modulus prescaler before exhibiting a second positive going edge of a pulse; i.e. between positive going edges, the prescaler will divide 10/10, 10/11, or 11/11 to provide 20, 21, or 22 modulus divisions, respectively, or one pulse out for 20, 21, or 22 pulses in, respectively.

While it would be evident to those skilled in the art that $N_1$ may be altered by integer steps (3, 4, 5, etc.) by changing the number of flip-flops provided in the circuitry, in the preferred embodiment since $N_1$ is equal to two, there is only one flip-flop 54. The flip-flop 54 provides one plus and one minus input to make a differential input to the translator 38. Thus, for every 2 positive going edges of pulses from the $N_0$ modulus prescaler 50, the flip-flop 54 will output one positive going edge of a pulse.

Referring now to FIG. 2, it will be seen that the $N_0$ modulus prescaler 50 will divide by 10 when the control logic 44 provides a high to the prescaler synchronizer 55 and $M_5$ 56 causes the latches 66 to provide a high output.

On the first positive going edge of a pulse from the $N_0$ modulus prescaler 50 to the clock input of the flip-flop 54, the flip-flop 54 changes state. This occurs because the D flip-flop 54 has its Q-bar output returned to the D input via nodes 56 and 58. This outputs the positive going edge of the Q output into the prescaler synchronizer 55 which synchronizes the divisions of the $N_0$ modulus prescaler 50 to the flip-flop 54. The Q output of the flip-flop 54 is inputted to the clock input of the flip-flop 62 to cause its Q output to go high or stay high.

The high Q output from the flip-flop 62 combined with the high output of the latches 66 applied to the inputs of the NOR gate 64 cause a low output therefrom. With the Q output of the flip-flop 54 high, the Q-bar output will be low to the node 56 and thus to the NOR gate 74. With both inputs to the NOR gate 74 low, a high output is provided to the second control input 78 of the $N_0$ modulus prescaler 50.

With the output of the latches 66 high and the ground 70 providing a permanent low, the NOR gate 68 outputs a low which when combined by the NOR gate 72 with the low from the Q-bar output of the flip-flop 62 produces a high on the first control input 76 to the $N_0$ modulus prescaler 50.

The $N_0$ modulus prescaler 50 provides one positive going edge of a pulse for every 10 input pulses when the control inputs 76 and 78 are both high. Thus, a second positive going edge of a pulse to the flip-flop 54 will not be provided until after 10 pulses have been received from the SSB mixer 22. This means an division of the input by 10.

With the second positive going edge of a pulse from the $N_0$ modulus prescaler 50, the signals to the NOR gates 64, 68, and 72 remain unaltered so as to maintain the control input 76 to the $N_0$ modulus prescaler 50 in its high condition which results in another 10 pulses from the SSB mixer 22 before a third positive going edge of a pulse is provided to the clock input of the flip-flop 54. Thus, between the first and second positive going edges out of the flip-flop 54 to the translator 38, there have been three positive going edges of pulses provided to the clock input of the flip-flop 54 from the $N_0$ modulus prescaler 50. The $N_0$ modulus prescaler 50 in turn has received 10 pulses from the SSB mixer 22 before outputting the first and second positive going edges of pulses (indicative of completion of the first division) and an additional 10 pulses before outputting the third positive going edge of a pulse (indicative of completion of the second division). A divide by 20 has been accomplished in the $N_1$-$N_0$ modulus prescaler 36.

The $N_0$ modulus prescaler 50 will divide by 11 when the control logic 44 provides a low to the flip-flop 62 and $M_5$ 56 causes a low out of the latches 66.

On the first positive going edge of a pulse from the $N_0$ modulus prescaler 50 to the clock input of flip-flop 54, the flip-flop 54 changes state. This causes the positive going edge of the Q output into the clock output of the flip-flop 62 of the $N_1$-$N_0$ modulus prescaler synchronizer 55 to cause the Q output of the flip-flop 62 to go low or stay low.

The low Q output from the flip-flop 62 combined with the low output of the latches 66 applied to the inputs of the NOR gate 64 cause a high output therefrom. With the Q output of the flip-flop 54 high, the Q-bar output will be low to the node 56 and thus to the NOR gate 74. With one input to the NOR gate 74 high, a low output is provided to the second control input 78 of the $N_1$-$N_0$ modulus prescaler 50.

With the output of the latches 66 low and the ground 70 providing a permanent low, the NOR gate 68 outputs a high which when combined by the NOR gate 72 with the high from the Q-bar output of the flip-flop 62 produces a low on the first control input 76 to the $N_0$ modulus prescaler 50.

The $N_0$ modulus prescaler 50 provides one positive going edge of a pulse for every 11 input pulses when the control inputs 76 and 78 are both low. Thus, a second positive going edge of a pulse to the flip-flop 54 will not be provided until after 11 pulses have been received from the SSB mixer 22. This means an effective division of the input by 11.

With the second positive going edge of a pulse from the $N_0$ modulus prescaler 50, the signals to the NOR gate 64, 68, and 72 remain unaltered and NOR gate 74 output remains unaltered so as to maintain the first and second control inputs 76 and 78 to the $N_0$ modulus prescaler 50 in their low conditions which results in another 11 input pulses from the SSB mixer 22 before a third positive going edge of a pulse is provided to the clock input of the flip-flop 54. Thus, between the first and second positive going edges out of the flip-flop 54, there have been three positive going edges of pulses provided to the clock input of the flip-flop 54 from the $N_0$ modulus prescaler 50. The $N_0$ modulus prescaler 50 in turn has received 11 pulses each from the SSB mixer 22 between the first and second and the second and third positive going edges of the pulses it outputs. Therefore, a divide by 22 has been accomplished in the $N_1$-$N_0$ modulus prescaler 36.

To achieve a third modulus, the $N_0$ modulus prescaler 50 will divide by 10 between the first and second positive going edges of the pulses it outputs and then by 11 between the second and third positive going edges of the pulses it outputs. This will occur when either of the inputs from the control logic 44 to the flip-flop 62 or from the latches 66 is high while the other is low.

Taking the condition of a high from the control logic 44 and a low out of the latches 66 as an example, on the first positive going edge of a pulse from the $N_0$ modulus prescaler 50 to the clock input of the flip-flop 54, the flip-flop 54 changes state. This causes the positive going edge of the Q output into the clock output of the flip-flop 62 to cause the Q output of the flip-flop 62 to go high or stay high.

The high Q output from the flip-flop 62 combined with the low output of the latches 66 applied to the inputs of the NOR gate 64 cause a low output therefrom. With the Q output of the flip-flop 54 high, the Q-bar output will be low to the node 56 and thus to the NOR gate 74. With both inputs to the NOR gate 74 low, a high output is provided to the second control input 78 of the $N_0$ modulus prescaler 50. With the output of the latches 66 low and the ground 70 providing a permanent low, the NOR gate 68 outputs a high which when combined by the NOR gate 72 with the low from the Q-bar output of the flip-flop 62 produces a low on the second control input 76. This combination of control inputs causes the $N_0$ modulus prescaler 50 to divide by 10 or receive 10 pulses between the first and second positive going edges of its output pulses.

With the second positive going edge of a pulse from the $N_0$ modulus prescaler 50 to the clock input of the flip-flop 54, the flip-flop 54 changes state. This positive going edge of the Q output into the clock output of the flip-flop 62 will cause the Q output of the flip-flop to remain high. The high Q output from the flip-flop 62 combined with the low output of the latches 66 applied to the inputs of the NOR gate 64 cause a low output therefrom. With the Q output of the flip-flop 54 low, the Q-bar output will be high to the node 56 and thus to the NOR gate 74. With one input to the NOR gate 74 high, a low output is provided to the second control input 78 of the $N_0$ modulus prescaler 50.

With the output of the latches 66 low and the ground 70 providing a permanent low, the NOR gate 68 provides a high which when combined by the NOR gate 72 with the high from the Q-bar output of the flip-flop 62 produces a low on the first control input 76 to the $N_0$ modulus prescaler 50.

With the two control inputs 76 and 78 to the $N_0$ modulus prescaler 50 low, it will divide by 11. Thus, between the first and third positive going edges of pulses to the flip-flop 54 which signal a complete transition of the flip-flop 54, there will be one interval where the prescaler is dividing by 10 and another where it is dividing by 11 for a total division of 21.

As would be evident to those skilled in the art, where the signals from the control logic 44 and from the latches 66 were reversed, the same situation would apply of one of the control inputs being low while the other toggles between high and low.

Thus, a multiple-multiple modulus prescaler of the two-two modulus type has been shown having moduli of 10/10, 10/11, and 11/11 which allows a minimum division of 200 as contrasted to a minimum division of 400 for a conventional two modulus prescaler of 20 and 21.

As evident to those skilled in the art, many other configurations of moduli are now practical with both $N_0$ and $N_1$ having various integer values 10, 11, and 12 or 16, 17, and 18, or 20, 22, and 24 being the most desirable. Also four, five, etc. modulus prescalers are possible by changing the value of $N_1$.

The operation of programmable frequency divider 34, and particularly programmable counters 40, control logic 44, and decade rate multiplier 46, will be further explained with reference to the flowchart of FIG. 3. The desired input frequency is provided in block 80, and in block 82 the quantities N, A, S, and RM. N is basically the division achieved by the programmable counters 40 in the programmable frequency divider 34 and in particular the major digits for integral value thereof. In particular, N=integer (F/20), where F in mHz is the desired frequency input to divider 34 and Fr 21 mHz.

A is a "units" value and is employed to control the modulus prescaler 50 hereinafter more fully described. M and A correspond to $M_c$ 42, FIG. 1.

S corresponds to $M_5$ in FIGS. 1 and 2 and provides the input to latches 66. In the particular example, if F>=21 * N then S=1 else S=0 or S=integer (F/(21 * N)). If S=0 then the modulus for prescaler 36=20/21, but if S=1 then the modulus for prescaler 36=21/22.

A, which is used to program the higher number of counts=F−N * (20+S).

It should be noted that the basic cycle for the programmable frequency divider 34 is determined by the decade rate multiplier 46. In particular, the decade rate multiplier 46 has 50 time slots or cycles of the programmable counters 40 in the basic cycle. Each of the 50 cycles may have a 'true' output present from the decade rate multiplier depending on the programmed rate input RM corresponding to M1 48 in FIG. 1. This produces the fractional division in multiples of 1/50 of Fr, that is, 20 kHz increments of frequency.

The major digits N and units digits A and fractional digits RM are related as follows. During each basic cycle for the decade rate multiplier 46, there are 50 subframes of N which occur where N cycles of the multiple modulus comprise the major digits of the division. In turn, each N cycle is divided into multiple modulus subcycles which count plus one for A cycles out of N and also count plus one if the decade rate multiplier output is 'true'. The numbers A and RM control the modulus prescaler to do this.

Referring further to FIG. 3, the afore mentioned quantities N, A, S, and RM are latched in block 84 and the latches are read in block 86. In decision block 88, the determination is made as to whether S is 1. If it is, a branch is made to the right for providing the 22/21 modulus, and if it is not, branch is made to the left providing the 21/20 modulus. As will be recalled, S is supplied as $M_5$ in FIG. 1.

Assuming the branch to the left, decision block 90 is entered and the determination is made whether R (i) is true, that is whether a decade rate multiplier 46 pulse exists for a particular time slot. If it does, a series of blocks 92, 94, and 96 are entered for providing a modulus of 21 through control of the D input of block 62 in FIG. 2 as herein before described. N is then decremented in block 98.

If N is not yet 0 in decision block 100, decision block 104 is entered to determine whether A is greater than 0. If it is, then A is decremented in block 102 and block 92 is re-entered, and otherwise the series of blocks, 104, 106, 108 and 110 are followed whereby the inputs 76, and 78 of prescaler 50 are determined so that a division of 20 is accomplished.

After N is reduced to 0, decision block 112 is entered from decision block 100 wherein it is determined whether the rate input from decade rate multiplier 46 has ended, i.e. whether the decade rate cycle has completed. If it has, return is made to read latch block 86, and if it has not, the program proceeds to block 114 where the next part of the rate cycle is entered and the values N, A, and S are reset. The program then returns to decision block 88.

Basically the same procedure is followed in the right-hand side of the flowchart wherein if an R (i) pulse is present the sequence of blocks 118, 120, 122, 124 is followed, but if the decade rate multiplier pulse is not present, then block 116 causes the sequence 126, 128, 130, 132. If N has not been reduced to 0 as determined in decision block 134, then a question is answered in block 138 whether A is greater than 0. If it is, then A is decremented in block 136 and return is made to the righthand sequence for providing division by 22 and if A is not greater than 0, then the lefthand sequence 126, 128, 130 and 132 is again followed to provide division by 21.

It will be seen that S (determined by $M_5$ input in FIG. 2) selects whether the prescaler 50 is in the 20, 21 mode or the 21, 22 mode. Moreover, A controlling the D input of flip-flop 62 in FIG. 2 determines whether the circuit switches between modulus divisions in the manner herein before described. A essentially determines whether an extra count is present or not. The frequency division provided by divider 34 is thus readily programmable over a wide range of values in accordance with the output frequency desired.

As many possible embodiments may be made of the present invention without a departure from the scope thereof. It is to be understood that all matters set forth herein or shown in the accompanying drawings are to be interpreted in an illustrative and not a limiting sense.

We claim:

1. In a phase-locked loop frequency synthesizer wherein a synthesized output signal is supplied by a controlled oscillator, said controlled oscillator operatively connected to a programmable frequency divider which divides said synthesized output signal by a programmable factor to provide a feedback signal, said programmable frequency divider connected to and providing said feedback signal to a phase detector circuit, said phase detector circuit responsive to a reference signal of a predetermined frequency and to said feedback signal to provide an error signal which diminishes as the reference and feedback signals become equal, and said controlled oscillator output frequency increases or decreases until said error signal is zeroed, wherein the improvement comprises:

a multiple modulus prescaler disposed in said programmable frequency divider, said multiple modulus prescaler operatively connected to said controlled oscillator, said multiple modulus prescaler responsive to first and second control inputs to respectively divide said synthesized output signal by a first and second modulus and to output prescaled signals indicative of completion of said divisions;

dividing means disposed in said programmable frequency divider connected to said multiple modulus prescaler and responsive to signals therefrom to divide the prescaled signals and output divided signals indicative of completion of said divisions; and programmable means disposed in said programmable frequency divider connected to said multiple modulus prescaler and said dividing means, said programmble means responsive to said divided signals and to said programmable factor to provide said first and second control inputs after successive outputs of said divided signals.

2. The improvement as claimed in claim 1 wherein said programmable frequency divider includes high and low frequency components and said programmable frequency divider includes translator means connected to said dividing means for connecting low frequency signals therefrom for use by the remaining high frequency components.

3. In a phase-locked loop frequency synthesizer wherein a synthesized output signal is supplied by a voltage controlled oscillator, said voltage controlled oscillator is connected to programmable signal mixing circuitry for mixing said synthesized output signal with a predetermined modification of a reference signal of a predetermined frequency to output a mixed signal to a programmable frequency divider, said programmable frequency divider for dividing said mixed signal by a programmable factor to provide a feedback signal, said programmable frequency divider connected to and providing said feedback signal to a phase detector circuit, said phase detector circuit responsive to said reference signal and to said feedback signal to provide an error signal which diminishes as the reference and feedback signals become equal, and said voltage controlled oscillator output frequency increases or decreases until said error signal is zeroed, wherein the improvement comprises:

a two modulus prescaler disposed in said programmable frequency divider, said two modulus prescaler connected to said signal mixing circuitry, said two modulus prescaler having first and second control inputs and responsive to a first control signal on either of said control inputs to divide said mixed signal by said first modulus and responsive to a second control signal on said first and second control inputs to divide by said second modulus, said two modulus prescaler providing a prescaled signal upon completion of division by said first or second modulus;

divide-by-two circuitry disposed in said programmable frequency divider connected to said two modulus prescaler and responsive to signals therefrom to divide the prescaled output thereof by two and output divided signals indicative of completion of said divide-by-two division; and programmable prescaler synchronizer means disposed in said programmable frequency divider connected to said two modulus prescaler and said divide-by-two circuitry, said prescaler synchronizer means responsive to said divided signals and said programmable factor to provide selectively (1) the first control signal to said first and second control inputs between successive outputs of said divided signals, (2) the second control signal to said first and second control inputs during successive outputs of said divided signals and (3) the first and second control signals to said first and second control inputs alternately during successive outputs of said divided signals.

4. The improvement as claimed in claim 3 wherein said two modulus prescaler, said divide-by-two circuitry, and said prescaler synchronizer means are emitter coupled logic components and the remainder of said programmable frequency divider is transistor-transistor logic, and including an emitter-coupled logic to transistor-transistor logic translator connected to said divide-by-two circuit.

5. A phase locked loop having a voltage controlled oscillator providing an output signal, programmable frequency divider means for dividing said output signal by a division factor to provide a divided output signal, phase detector means responsive to said divided output signal and a reference signal to develop an error signal, and means for filtering said error signal to control said voltage controlled oscillator, wherein said output signal is locked to said reference signal and has a frequency related to the product of the division factor and the frequency of said reference signal, said programmable frequency divider means comprising:

means for storing a preselected division factor;

multiple modulus prescaler means for dividing an input signal thereto selectively by different moduli;

input means for controlling said prescaler means to operate selectively with different moduli determined by control signals applied to said input means;

output dividing means driven by said prescaler means; and prescaler synchronizer means responsive to said output dividing means and to said storing means for applying different control signals to said input means during different sequential time periods to provide selectively to said input means (1) a first control signal during successive outputs of said output dividing means, (2) a second control signal during successive outputs of said output dividing means and (3) the first and second control signals, alternately, during successive outputs of said output dividing means, thereby providing a greater number of division factors than the moduli of said prescaler means.

6. The improvement as claimed in claim 5 wherein said synchronizer means is controllable to change the division produced by said prescaler means on alternate half cycles of the operation of said output dividing means.

7. The improvement as claimed in claim 5 wherein said programmable prescaler synchronizer means is provided with means for controlling sequences of division counts by the combination of said prescaler means and dividing means during a cycle of operation to provide an oscillator output frequency under substantially exact control of said programmable factor.

8. A method of frequency synthesis comprising:

setting a desired frequency;

setting a divider using said desired frequency to produce a divided signal by dividing selectively during alternate first and second time periods (1) by a first modulus for said first time period and said first modulus for said second time period, (2) by said first modulus for said first time period and a second modulus for said second time period, and (3) by said second modulus for said first time period and said second modulus for said second time period, depending upon the desired frequency and signals developed by said divider;

detecting a phase difference between said divided signal and a reference signal and outputting a control signal proportional thereto; and modifying an oscillator output frequency until said control signal is eliminated and said output frequency equals said desired frequency.

\* \* \* \* \*